United States Patent
Min et al.

(10) Patent No.: US 6,759,331 B1
(45) Date of Patent: Jul. 6, 2004

(54) METHOD FOR REDUCING SURFACE ZENER DRIFT

(75) Inventors: Heikyung Min, Palo Alto, CA (US); Steven Kurihara, San Jose, CA (US); Robert Spence, Skelmorlie (GB)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/438,481

(22) Filed: May 15, 2003

Related U.S. Application Data

(62) Division of application No. 10/032,930, filed on Oct. 29, 2001.

(51) Int. Cl.[7] .............................................. H01L 21/44
(52) U.S. Cl. ........................ 438/675; 438/637; 438/618
(58) Field of Search ................................. 438/637–369, 438/675–678, 622, 700

(56) References Cited

U.S. PATENT DOCUMENTS 5,117,276 A * 5/1992 Thomas et al. ............. 257/758

OTHER PUBLICATIONS

James Dunkley et al., "Hot Electron Induced Hydrogen Compensation of Boron Doped Silicon Resulting From Emitter–Base Breakdown", IEEE, (1992) pp. 31.4.1–31.4.4.

M. Soltani–Farshi et al., "Thermal Behaviour of Implanted Nitrogen and Accumulated Hydrogen in Titanium", (1998), Mat. Res. Soc. Symp. Proc. vol. 504, Materials Research Society, pp. 231–237.

O.N. Senkov and J.J. Jonas, "Dynamic Strain Aging and Hydrogen–Induced Softening in Alpha Titanium", Metallurgical and Materials Transactions A. vol. 27A, Jul. 1996, pp. 1877–1887.

Stanley Wolf Ph.D., Silicon Processing For the VLSI Era, vol. 2: Process Integration, Lattice Press, (1990), pp. 191 and 124–125.

* cited by examiner

Primary Examiner—Dung A. Le
(74) Attorney, Agent, or Firm—Mark C. Pickering

(57) ABSTRACT

Drift in the reverse breakdown voltage of a surface zener diode is substantially reduced by forming a layer of material that includes titanium before or after the metallization steps that are used to form the first layer of metal (the metal-1 layer) or the second layer of metal (the metal-2 layer).

20 Claims, 7 Drawing Sheets

METHOD FOR REDUCING SURFACE ZENER DRIFT

This is a divisional application of application Ser. No. 10/032,930 filed on Oct. 29, 2001.

BACKGROUND OF THE INVENTION

1. Field of the Invention

The present invention relates to surface zener diodes and, more particularly, to an apparatus and method for reducing surface zener drift in a zener diode.

2. Description of the Related Art

A zener diode is a pn junction that has a reverse breakdown voltage that defines two distinctly different regions of reverse-bias operation. When the pn junction is reverse biased, but the reverse-biased voltage is less than the reverse breakdown voltage, only a small leakage current flows through the junction.

On the other hand, when the reverse-biased voltage is increased to exceed the reverse breakdown voltage, a large breakdown current flows through the junction. Zener diodes are commonly used to provide a stable reference voltage by permanently biasing the diode to have a reverse-biased voltage that is greater than the reverse breakdown voltage.

FIG. 1 shows a cross-sectional view that illustrates a conventional surface zener diode 100. As shown in FIG. 1, diode 100, which is formed in a n− semiconductor material 108, includes a n+ region 110 and an adjacent and overlapping p region 112 that are formed in n− material 108.

In operation, when a first voltage is placed on n+ region 110 and a lower second voltage is placed on p region 112 such that the reverse biased voltage is less than the reverse breakdown voltage, only a small leakage current flows through the junction.

However, when the voltage on n+ region 110 is increased to exceed the reverse breakdown voltage of diode 100, a large breakdown current flows through the junction. When the breakdown current flow is primarily a lateral flow across the junction at the surface of p region 112, diode 100 is often referred to as a lateral diode or a surface zener diode.

One surface zener diode problem, known as surface zener drift, occurs when the reverse breakdown voltage of the diode drifts over time. Since the active junction formed between n+ region 110 and p region 112 is primarily a surface junction, it is more susceptible to the presence of hydrogen. The presence of hydrogen can significantly increase the reverse breakdown voltage characteristics of the diode, resulting in an observed voltage drift over time. When the diode is used as a stable reference voltage (the diode is permanently biased to have a reverse-biased voltage that is greater than the reverse breakdown voltage), the drift can lead to degraded circuit operation and potential device failure.

Thus, there is a need for a method of forming a surface zener diode that minimizes drift in the reverse breakdown voltage over time.

SUMMARY OF THE INVENTION

The present invention provides a method of forming a surface zener diode that substantially reduces drift in the reverse breakdown voltage of the diode. A semiconductor structure formed in accordance with the present invention is formed in a semiconductor material of a first conductivity type. The semiconductor structure includes a first region of the first conductivity type that is formed in the semiconductor material. The first region has a dopant concentration that is greater than the dopant concentration of the semiconductor material.

The semiconductor structure also includes a second region of a second conductivity type that is formed in the semiconductor material to adjoin the first region, and a layer of isolation material that is formed on the semiconductor material.

The semiconductor structure also includes a conductive contact that is formed through the layer of isolation material to make an electrical contact with the first region. In addition, a first metal trace is formed over the layer of isolation material and the conductive contact.

The semiconductor structure additionally includes a layer of insulation material that is formed on the first metal trace, and a conductive via that is formed through the layer of insulation material to make an electrical contact with the first metal trace. Further, the structure includes a second metal trace that is formed on the layer of insulation material and the conductive via to make an electrical contact with the conductive via. In addition, a layer of passivation material is formed over the second metal trace. The layer of passivation material, in turn, includes nitride.

In accordance with the present invention, the semiconductor structure also includes a titanium protection layer that is formed over the layer of isolation material and the conductive contact, and below the layer of passivation material. The titanium protection layer can be formed on the isolation layer and the conductive contact under the first metal trace, or on and over the second metal trace. Alternately, the titanium protection layer can be formed on the insulation layer and the conductive via under the second metal trace, or on and over the second metal trace.

The present invention also includes a method for forming a semiconductor structure in a semiconductor material of a first conductivity type. The semiconductor structure includes a first region of the first conductivity type that is formed in the semiconductor material. The first region has a dopant concentration that is greater than the dopant concentration of the semiconductor material.

The semiconductor structure also includes a second region of a second conductivity type that is formed in the semiconductor material to adjoin the first region, and a layer of isolation material that is formed on the semiconductor material. The semiconductor structure also includes a conductive contact that is formed through the layer of isolation material to make an electrical contact with the first region.

The method of the present invention includes the steps of forming a first metal trace over the layer of isolation material and the conductive contact, and forming a layer of insulation material on the first metal trace. The method also includes the step of forming a conductive via through the layer of insulation material to make an electrical contact with the first metal trace.

The method further includes the step of forming a second metal trace on the layer of insulation material and the conductive via to make an electrical contact with the conductive via. The method additionally includes the steps of forming a layer of passivation material over the second metal trace, and forming a titanium protection layer over the layer of isolation material and the conductive contact, and below the layer of passivation material. The layer of passivation material includes nitride.

A better understanding of the features and advantages of the present invention will be obtained by reference to the following detailed description and accompanying drawings

DETAILED DESCRIPTION

Figure 1:
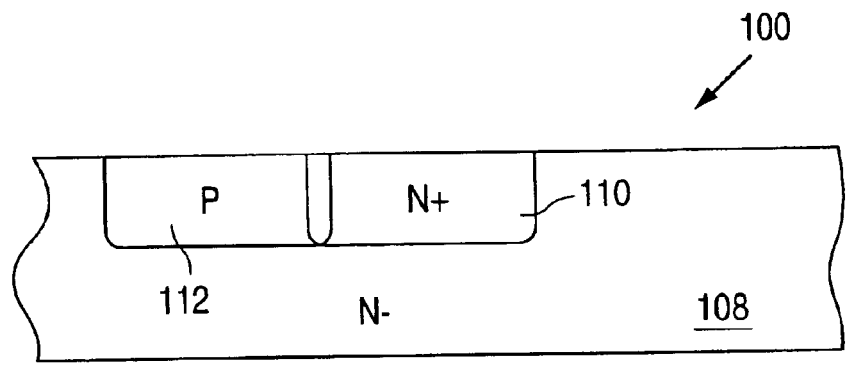
FIG. 1 is a cross-sectional view illustrating a conventional surface zener diode 100.
Figure 2:
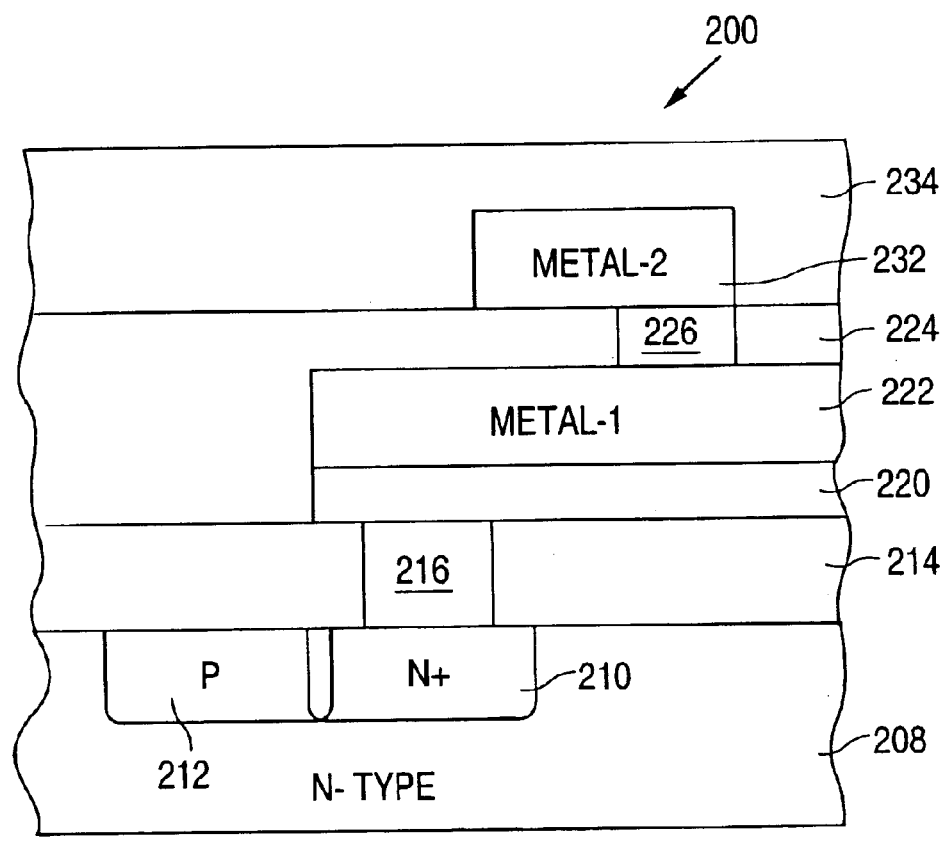
FIG. 2 is a cross-sectional view illustrating a portion of a semiconductor structure 200 in accordance with the present invention.

FIG. 2 shows a cross-sectional view that illustrates a portion of a semiconductor structure 200 in accordance with the present invention. As described in greater detail below, a layer of material that includes titanium is incorporated into the metallization steps to substantially reduce drift in the reverse breakdown voltage of a surface zener diode.

In the example shown in FIG. 2, structure 200, which is formed in an n-type material 208 such as a well or a substrate, includes an n-type region 210 and a p-type region 212 that are formed in material 208. As further shown, p-type region 212 is adjacent to and overlaps n-type region 210. In the FIG. 2 example, n-type region 210 and p-type region 212 form a surface zener diode where n-type region 210 is heavily doped and the dopant concentration of p-type material 212 controls the reverse breakdown voltage.

Further, structure 200 includes a layer of isolation material 214 that is formed on material 208. Isolation material 214 can be implemented with, for example, a layer of silicon dioxide. In addition, structure 200 also includes an ohmic conductive contact 216 that is formed through isolation layer 214 to make an electrical contact with n+ region 210. Contact 216 includes a metallic material, such as aluminum or aluminum silicon, and can include a layer of platinum silicide or a diffusion barrier formed between the metallic material and the surface of n+ region 210.

In accordance with the present invention, structure 200 additionally includes a titanium protection layer 220 that is formed on isolation layer 214 and contact 216. Titanium protection layer 220 can be implemented with, for example, titanium, titanium-tungsten, or titanium metal silicides.

As further shown in FIG. 2, structure 200 includes a first metal (metal-1) trace 222 that is formed on titanium protection layer 220. Metal-1 trace 222 can be implemented with, for example, aluminum, an aluminum alloy, or copper. Structure 200 also includes a layer of insulation material 224 that is formed on metal-1 trace 222. Insulation material 224 can be implemented with, for example, a doped layer of silicon dioxide or a low-temperature TEOS film.

In addition, structure 200 includes a conductive via 226 that is formed through insulation layer 224 to make an electrical contact with metal-1 trace 222. Conductive via 226 can be implemented with, for example, tungsten, aluminum, or copper.

Structure 200 further includes a second metal (metal-2) trace 232 that is formed on insulation layer 224 and conductive via 226. Metal-2 trace 232 is formed to make an electrical contact with conductive via 226, and can be implemented with, for example, aluminum, an aluminum alloy, or copper. In addition, a layer of passivation material 234 is formed on metal-2 trace 232. Passivation material 234 includes a layer of nitride, and can include a layer of vapox over metal (VOM) formed between metal-2 trace 232 and the layer of nitride.

In operation, a first voltage is applied to n+ region 210 and a lower second voltage is applied to p region 212. The difference between the first voltage and the second voltage is greater than the reverse breakdown voltage of the surface zener diode, thereby biasing the diode in the reverse breakdown region.

Experimental results indicate that the present invention significantly reduces the drift that occurs in the reverse breakdown voltage of a surface zener diode over time. The drift in the reverse breakdown voltage of a surface zener diode is believed to result from mobile hydrogen pairing up with available holes at the surface pn junctions, effectively lowering the concentration of the boron dopant of p-type region 212 at the surface pn junction.

Mobile hydrogen is generated as a standard by-product of the plasma-enhanced chemical-vapor-deposit (PECVD) process used to form the nitride in passivation layer 234. No appreciable drift was observed during experiments on parts that were processed without nitride passivation (VOM only).

In the present invention, titanium protection layer 220 is believed to getter the mobile hydrogen released from the plasma-enhanced nitride passivation process, thereby leaving an insufficient amount of mobile hydrogen to appreciably counter-dope the boron at the surface pn junctions of the devices.

FIGS. 3A–3H show cross-sectional views that illustrate a method of forming a semiconductor structure, such as structure 200, in accordance with the present invention. In the example shown in FIG. 3A, the method of the present invention utilizes a semiconductor structure 306 that has been prepared using conventional processes and steps.

Figure 3A:
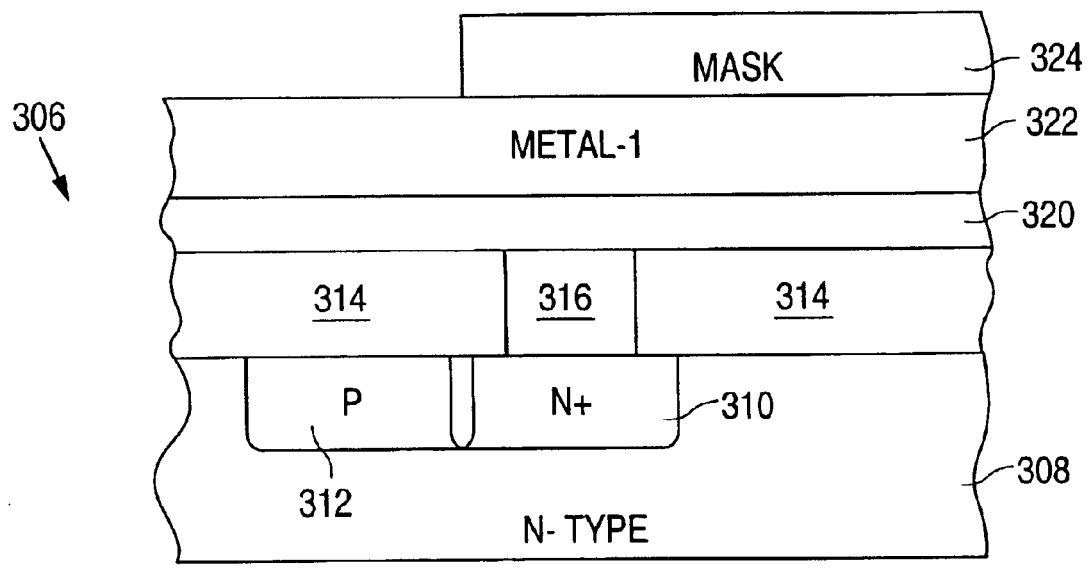
FIGS. 3A–3H are cross-sectional views illustrating a method of forming a semiconductor structure, such as structure 200, in accordance with the present invention.

As shown in FIG. 3A, structure 306, which is formed in an n-type material 308 such as a well or a substrate, includes a heavily-doped n-type region 310 and an adjacent and overlapping p-type region 312 that are formed in n-type material 308. In addition, structure 306 includes a layer of isolation material 314 that is formed on material 308. Isolation layer 314 can be implemented with, for example, a layer of silicon dioxide.

In addition, structure 306 also includes an ohmic conductive contact 316 that is formed through isolation layer 314 to make an electrical contact with n+ region 310. Contact 316 includes a metallic material, such as aluminum or aluminum silicon, and can include a layer of platinum suicide or a diffusion barrier formed between the metallic material and the surface of n+ region 310.

Referring to FIG. 3A, the method of the present invention begins by forming a layer of titanium protection material 320 on isolation material 314 and conductive contact 316. Titanium protection material 320 can be implemented with, for example, titanium, titanium-tungsten, platinum-titanium-tungsten, or titanium metal silicides.

Next a first layer of metal (metal-1) 322 is deposited on titanium protection layer 320. Metal-1 layer 322 can be implemented with, for example, aluminum, an aluminum alloy (e.g., Al, 2% Cu), or copper. After metal-1 layer 322 has been deposited on titanium protection layer 320, a first metal trace mask 324 is formed and patterned on metal-1 layer 322.

Figure 3B:
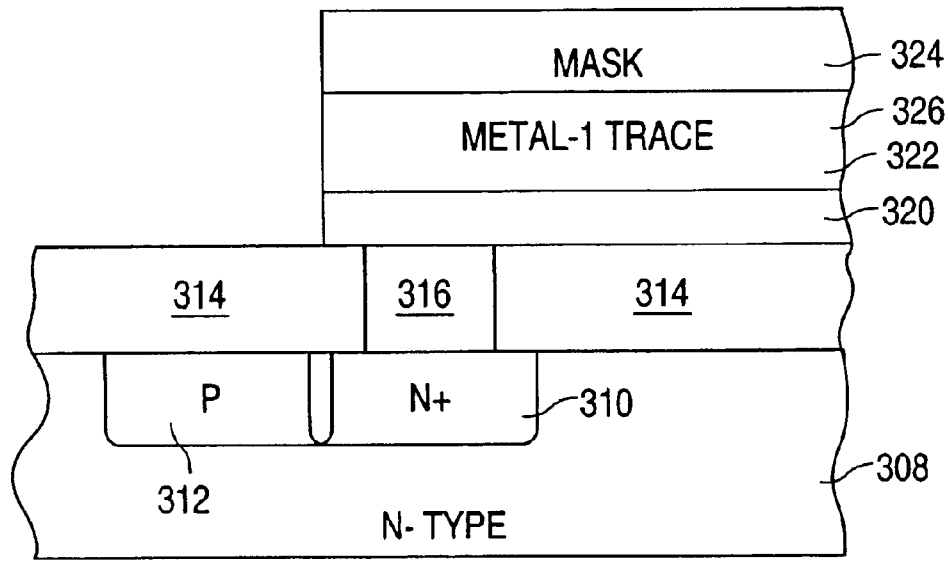

Referring to FIG. 3B, following the patterning of mask 324, the exposed portion of metal-1 layer 322 is etched until metal-1 layer 322 and the underlying layer of titanium protection material 320 are removed from the surface of the underlying isolation layer 314. Mask 324 is then removed. The etch defines a first metal trace 326 and exposes regions of isolation layer 314.

Figure 3C:
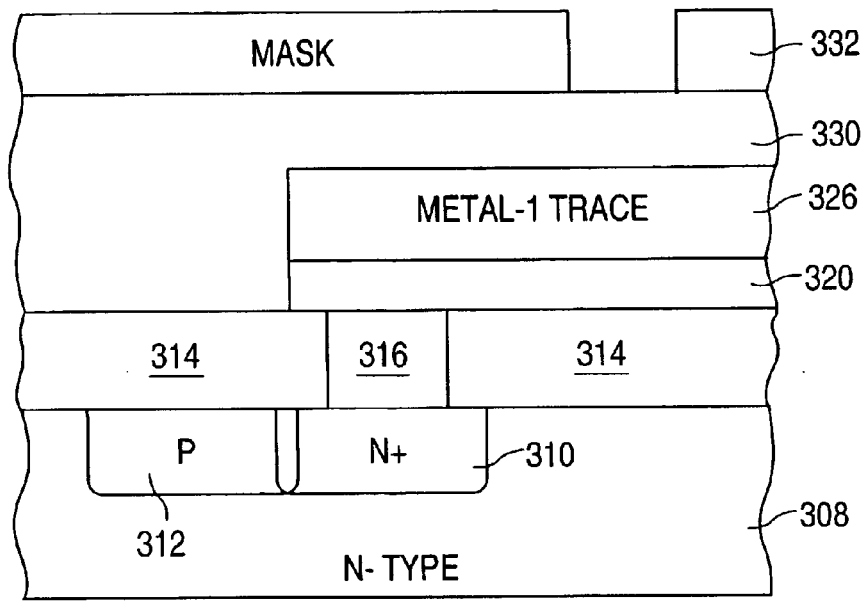

Referring to FIG. 3C, after first metal trace mask 324 has been removed, a layer of insulation material 330 is deposited on the surface of metal trace 326 and the exposed regions of isolation layer 314. Insulation layer 330 can be implemented with, for example, a doped layer of silicon dioxide, a low-temperature TEOS film, or spin on glass SOG). Following this, a via mask 332 is formed and patterned on insulation layer 330.

Figure 3D:
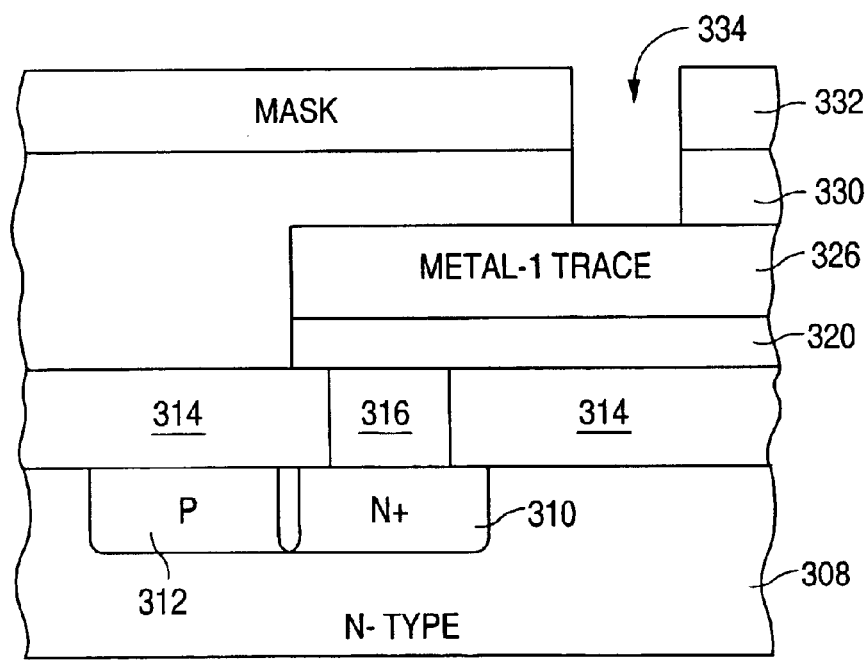
Figure 3E:
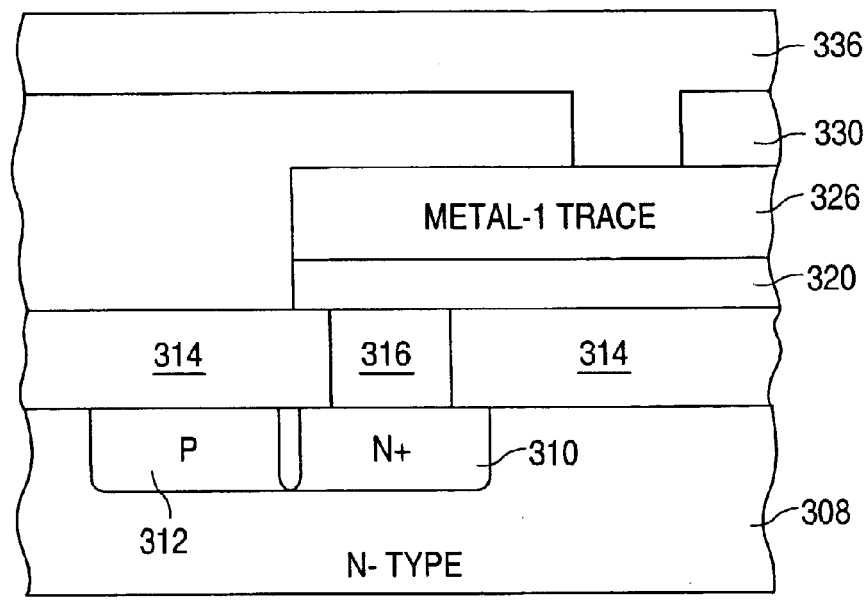

Referring to FIG. 3D, following the patterning of via mask 332, the exposed portions of insulation layer 330 are etched to remove insulation layer 330 from metal trace 326 to form a via opening 334. After this, via mask 332 is removed. Referring to FIG. 3E, once via mask 332 has been removed, a layer of via metal 336, such as tungsten, is deposited on insulation layer 330 to fill up via openings 334 and make an electrical connection with metal trace 326.

Figure 3F:
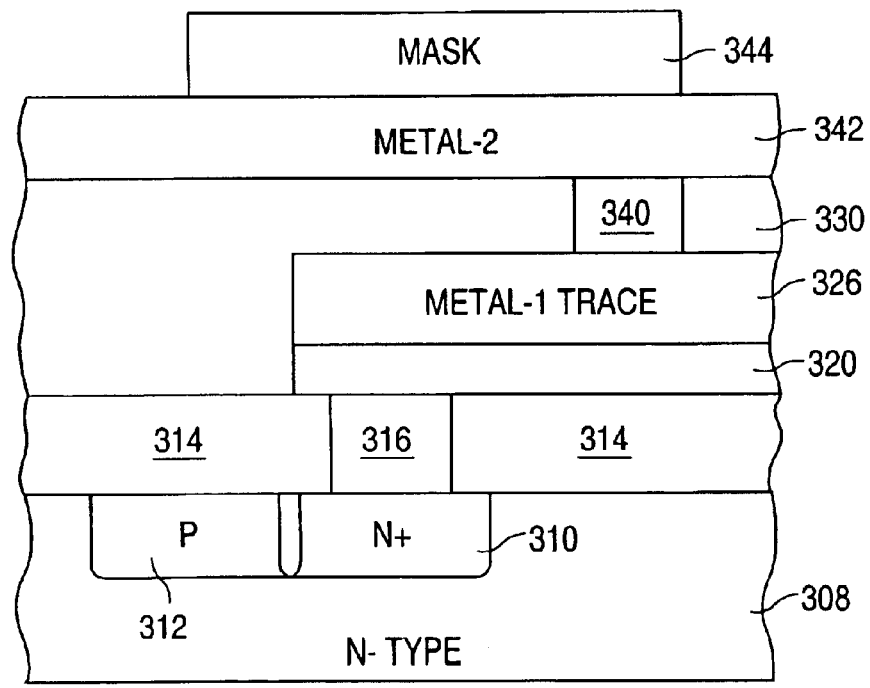

Referring to FIG. 3F, after via metal layer 336 has been deposited, via metal layer 336 is etched to remove via metal layer 336 from the top surface of insulation layer 330 and form a via 340. Next, a second layer of metal (metal-2) 342 such as, for example, aluminum, an aluminum alloy (e.g., Al, 0.5% Cu), or copper, is deposited on insulation layer 330 and via 340 to make an electrical contact with via 340. Following this, a second metal trace mask 344 is formed and patterned on metal-2 layer 342.

Figure 3G:
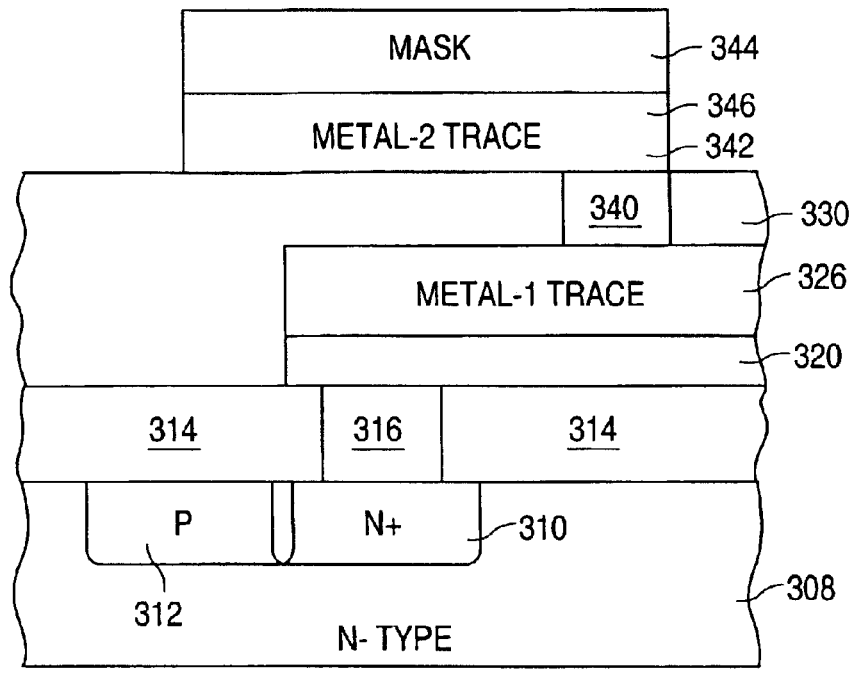

Referring to FIG. 3G, after mask 344 has been patterned, the exposed portion of metal-2 layer 342 is etched until metal-2 layer 342 is removed from the surface of the underlying insulation layer 330. Following the etch, mask 344 is removed. The etch defines a second metal trace 346 and exposes regions of insulation layer 330.

Figure 3H:
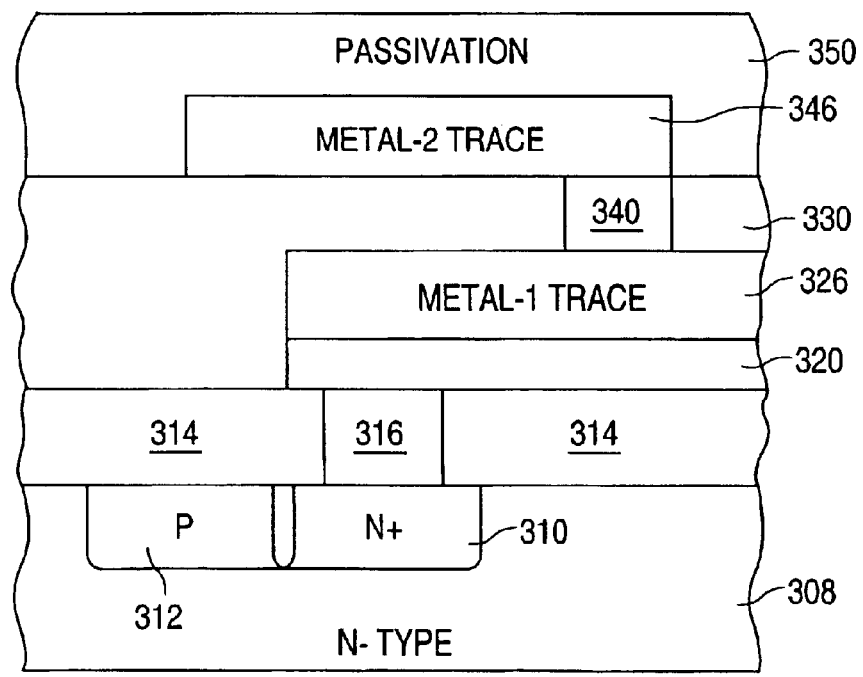

Referring to FIG. 3H, after second metal trace mask 344 has been removed, a layer of passivation material 350 is deposited on the surface of metal trace 346 and the exposed regions of insulation layer 330. Passivation layer 350 includes a nitride layer that is formed using conventional plasma-enhanced, chemical-vapor-deposition (PECVD), and can include a layer of VOM formed on metal trace 346 between metal trace 346 and the nitride layer. The method of the present invention then continues with conventional back-end processing steps.

Figure 4:
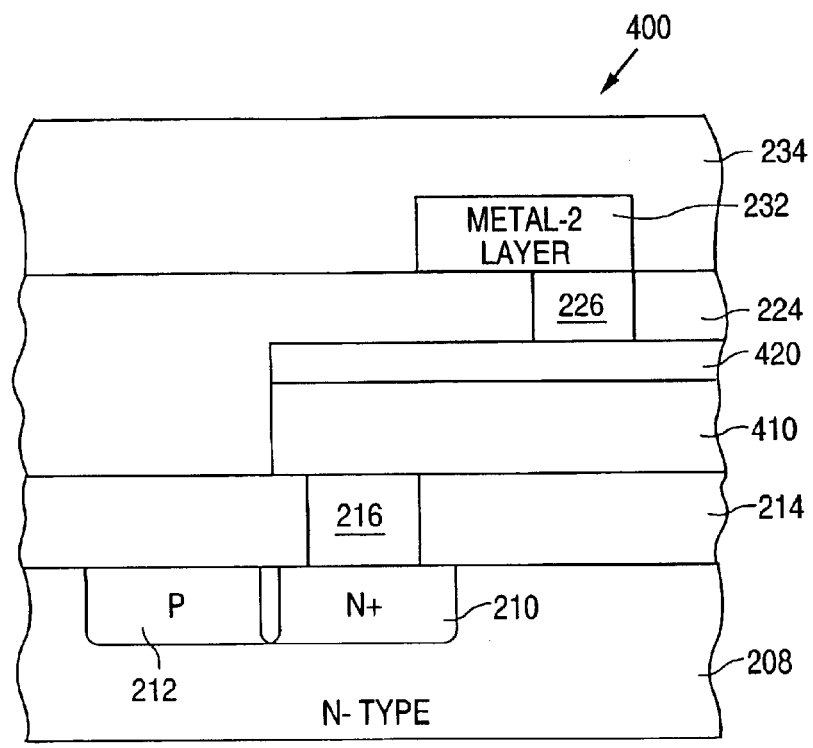
FIG. 4 is a cross-sectional view illustrating a portion of a semiconductor structure 400 in accordance with the present invention.

Alternately, rather than forming the titanium protection layer under the metal-1 layer, the titanium protection layer can be formed on the top surface of the metal-1 layer. FIG. 4 shows a cross-sectional view that illustrates a portion of a semiconductor structure 400 in accordance with the present invention. Structure 400 is similar to structure 200 and, as a result, utilizes the same reference numerals to designate the structures that are common to both structures.

As shown in FIG. 4, structure 400 differs from structure 200 in that structure 400 has a metal-1 layer 410 that is formed on isolation layer 214 and contact 216, and a titanium protection layer 420 that is formed on metal-1 layer 410. Further, insulation layer 224 and conductive via 226 are formed on titanium protection layer 420 rather than the metal-1 layer.

Structure 400 can be formed by altering the steps shown in FIGS. 3A–3H. Rather than forming titanium protection layer 320 on isolation layer 314 and conductive contact 316, metal-1 layer 322 is instead formed on isolation layer 314 and conductive contact 316, followed by the formation of titanium protection layer 320 and then mask 324.

Figure 5:
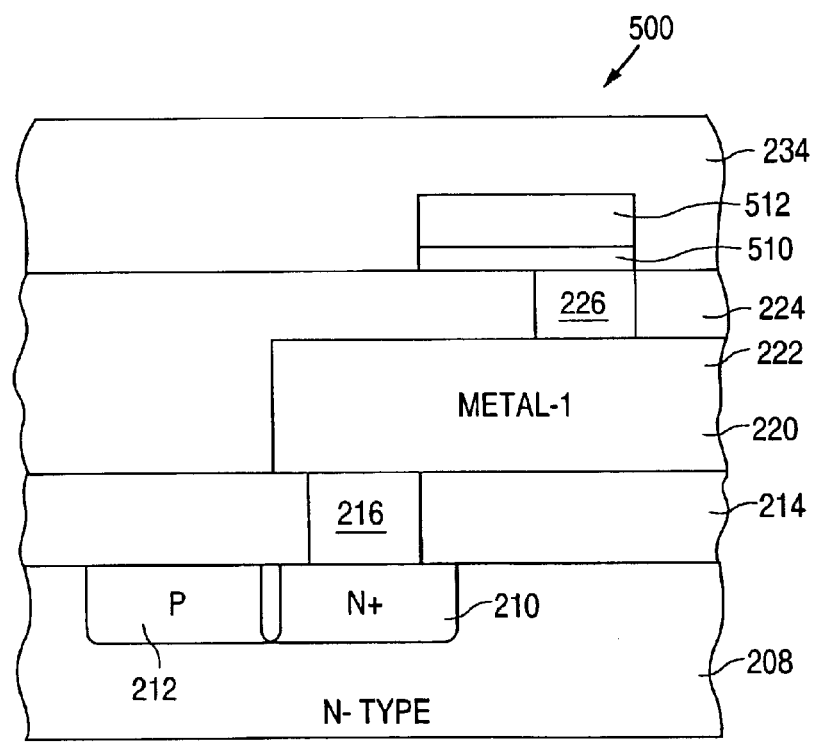
FIG. 5 is a cross-sectional view illustrating a portion of a semiconductor structure 500 in accordance with the present invention.

The titanium protection layer can alternately be formed under the metal-2 layer. FIG. 5 shows a cross-sectional view that illustrates a portion of a semiconductor structure 500 in accordance with the present invention. Structure 500 is similar to structure 200 and, as a result, utilizes the same reference numerals to designate the structures that are common to both structures.

As shown in FIG. 5, structure 500 differs from structure 200 in that structure 500 has a titanium protection layer 510 that is formed on insulation layer 224 and via 226, and a metal-2 layer 512 that is formed on titanium protection layer 510.

Structure 500 can be formed by altering the steps shown in FIGS. 3A–3H. Rather than forming titanium protection layer 320 on isolation layer 314 and conductive contact 316, metal-1 layer 322 is instead formed on isolation layer 314 and conductive contact 316. The steps continue as described in FIGS. 3A–3H until the deposition of metal-2 layer 342.

At this point, rather than forming metal-2 layer 342 on insulation layer 330 and via 340, titanium protection layer 320 is instead formed on insulation layer 330 and via 340. Following this, metal-2 layer 342 is formed on titanium protection layer 320, and then mask 344 is formed on metal-2 layer 342.

Figure 6:
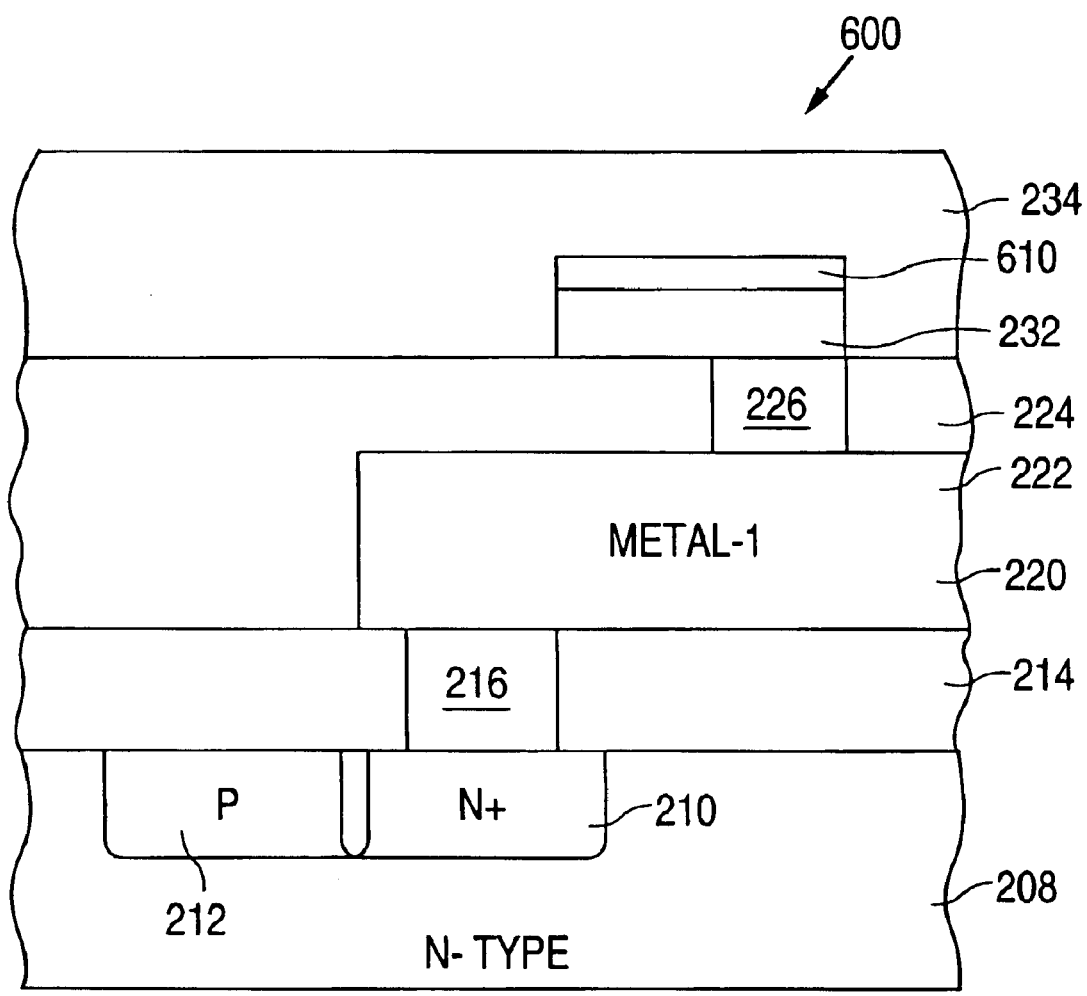
FIG. 6 is a cross-sectional view illustrating a portion of a semiconductor structure 600 in accordance with the present invention.

The titanium protection layer can alternately be formed on the top surface of the metal-2 layer. FIG. 6 shows a cross-sectional view that illustrates a portion of a semiconductor structure 600 in accordance with the present invention. Structure 600 is similar to structure 200 and, as a result, utilizes the same reference numerals to designate the structures that are common to both structures.

As shown in FIG. 6, structure 600 differs from structure 200 in that structure 600 has a titanium protection layer 610 that is formed on metal-2 layer 232. In addition, passivation layer 234 is formed on insulation layer 224 and layer 610.

Structure 600 can be formed by altering the steps shown in FIGS. 3A–3H. Rather than forming titanium protection layer 320 on isolation layer 314 and conductive contact 316, metal-1 layer 322 is instead formed on isolation layer 314 and conductive contact 316. The steps continue as described in FIGS. 3A–3H until the formation of mask 344.

At this point, rather than forming mask 344 on metal-2 layer 342, titanium protection layer 320 is instead formed on metal-2 layer 342. Following this, mask 344 is formed on titanium protection layer 320.

Thus, an apparatus and method for reducing drift in the reverse breakdown voltage of a surface zener diode has been described. With titanium added as part of the metal process, experimental results indicate that the drift in the reverse breakdown voltage is significantly reduced, and low enough for the device to function properly under normal operating conditions.

It should be understood that various alternatives to the method of the invention described herein may be employed in practicing the invention. Thus, it is intended that the following claims define the scope of the invention and that methods and structures within the scope of these claims and their equivalents be covered thereby.

What is claimed is:

1. A method of forming a semiconductor structure in a semiconductor material of a first conductivity type, the semiconductor material having a first dopant concentration, the semiconductor structure comprising:

a first region of the first conductivity type formed in the semiconductor material, the first region having a dopant concentration that is greater than the dopant concentration of the semiconductor material;

a second region of a second conductivity type formed in the semiconductor material to adjoin the first region;

a layer of isolation material formed on the semiconductor material;

a conductive contact formed through the layer of isolation material to make an electrical contact with the first region, the method comprising the steps of:

forming a first metal trace over the layer of isolation material and the conductive contact;

forming a layer of insulation material on the first metal trace;

forming a conductive via through the layer of insulation material to make an electrical contact with the first metal trace;

forming a second metal trace on the layer of insulation material and the conductive via to make an electrical contact with the conductive via;

forming a layer of passivation material over the second metal trace, the layer of passivation material including nitride; and forming a single interconnect layer over the layer of isolation material and the conductive contact, and below the layer of passivation material, the single interconnect layer including titanium.

2. The method of claim 1 wherein the single interconnect layer is formed on the isolation layer and the conductive contact under the first metal trace.

3. The method of claim 1 wherein the single interconnect layer is formed on and over the first metal trace.

4. The method of claim 1 wherein the single interconnect layer is formed on the insulation layer and the conductive via under the second metal trace.

5. The method of claim 1 wherein the single interconnect layer is formed on and over the second metal trace.

6. A method of forming a semiconductor structure over a semiconductor substrate, the method comprising the steps of:

forming a conductor layer over the semiconductor substrate;

forming a layer of cap material over the conductor layer, the layer of cap material including titanium;

selectively removing the conductor layer and the layer of cap material to form a first conductive trace that has a conductor region and a region of cap material;

forming a layer of isolation material over the first conductive trace, the layer of isolation material contacting the first conductive trace;

forming a conductive via through the layer of isolation material to make an electrical contact with the first conductive trace;

forming a layer of conductive material over the layer of isolation material, the layer of conductive material contacting the layer of isolation material and the via;

selectively removing the layer of conductive material to form a second conductive trace; and forming a layer of insulation material over the second conductive trace, the layer of insulation material contacting the second conductive trace.

7. The method of claim 6 wherein the conductor layer includes copper.

8. The method of claim 6 wherein the conductor layer includes aluminum.

9. The method of claim 6 and further comprising a zener diode formed in the semiconductor substrate, the first conductive trace being electrically connected to the zener diode.

10. A method of forming a semiconductor structure over a semiconductor substrate, the method comprising the steps of:

forming a conductor layer over the semiconductor substrate;

selectively removing the conductor layer to form a first conductive trace;

forming a layer of isolation material over the first conductive trace, the layer of isolation material contacting the first conductive trace;

forming a conductive via through the layer of isolation material to make an electrical contact with the first conductive trace;

forming a layer of lower material over the layer of isolation material, the layer of lower material including titanium;

forming a layer of conductive material over the layer of lower material, the layer of conductive material contacting the layer of lower material;

selectively removing the layer of conductive material and the layer of lower material to form a second conductive trace that has a conductive region and a region of lower material; and forming a layer of insulation material over the second conductive trace, the layer of insulation material contacting the second conductive trace.

11. The method of claim 10 wherein the conductor layer includes copper.

12. The method of claim 10 wherein the conductor layer includes aluminum.

13. A method of forming a semiconductor structure over a semiconductor substrate, the method comprising the steps of:

forming a conductor layer over the semiconductor substrate;

forming a layer of cap material over the conductor layer, the layer of cap material contacting the conductor layer and gettering hydrogen;

selectively removing the conductor layer and the layer of cap material to form a first conductive trace that has a conductor region and a region of cap material;

forming a layer of isolation material over the first conductive trace, the layer of isolation material contacting the first conductive trace;

forming a conductive via through the layer of isolation material to make an electrical contact with the first conductive trace;

forming a layer of conductive material over the layer of isolation material, the layer of conductive material contacting the layer of isolation material and the via;

selectively removing the layer of conductive material to form a second conductive trace; and forming a layer of insulation material over the second conductive trace, the layer of insulation material contacting the second conductive trace.

14. The method of claim 13 wherein the cap layer includes titanium.

15. The method of claim 14 wherein the conductor layer includes copper.

16. The method of claim 14 wherein the conductor layer includes aluminum.

17. A method of forming a semiconductor structure over a semiconductor substrate, the method comprising the steps of:

forming a conductor layer over the semiconductor substrate;

selectively removing the conductor layer to form a first conductive trace;

forming a layer of isolation material over the first conductive trace, the layer of isolation material contacting the first conductive trace;

forming a conductive via through the layer of isolation material to make an electrical contact with the first conductive trace;

forming a layer of lower material over the layer of isolation material, the layer of lower material contacting the layer of isolation material and the via, and gettering hydrogen;

forming a layer of conductive material over the layer of lower material, the layer of conductive material contacting the layer of lower material;

selectively removing the layer of conductive material and the layer of lower material to form a second conductive trace that has a conductive region and a region of lower material; and forming a layer of insulation material over the second conductive trace, the layer of insulation material contacting the second conductive trace.

18. The method of claim 17 wherein the lower layer includes titanium.

19. The method of claim 18 wherein the conductor layer includes copper.

20. The method of claim 18 wherein the conductor layer includes aluminum.

* * * * *

UNITED STATES PATENT AND TRADEMARK OFFICE
CERTIFICATE OF CORRECTION

PATENT NO. : 6,759,331 B1
DATED : July 6, 2004
INVENTOR(S) : Min et al.

It is certified that error appears in the above-identified patent and that said Letters Patent is hereby corrected as shown below:

Column 4,
Line 56, delete "suicide" and replace with -- silicide --.
Line 65, after "Next" insert -- , --.

Column 5,
Line 18, delete "SOG)" and replace with -- (SOG) --.

Signed and Sealed this

Twenty-third Day of November, 2004

JON W. DUDAS
*Director of the United States Patent and Trademark Office*